United States Patent

Horio et al.

[11] Patent Number: 5,883,563
[45] Date of Patent: Mar. 16, 1999

[54] THERMO-ELECTRIC MATERIAL HAVING MEAN CRYSTAL GRAIN DIAMETER NOR GREATER THAN 50 MICRONS AND MEAN ASPECT RATIO BETWEEN 1 AND 3 FOR LARGE FIGURE OF MERIT AND THERMO-ELECTRIC ELEMENT USING THE SAME

[75] Inventors: Yuma Horio; Hiroyuki Yamashita; Toshiharu Hoshi, all of Shizuoka, Japan

[73] Assignee: Yamaha Corporation, Japan

[21] Appl. No.: 847,653

[22] Filed: Apr. 30, 1997

[30] Foreign Application Priority Data

May 1, 1996 [JP] Japan ................................. 8-111025

[51] Int. Cl.$^6$ ..................................................... H01C 7/10
[52] U.S. Cl. ......................................... 338/22 SD; 75/228
[58] Field of Search ........................... 338/22 R, 22 SD; 252/58.1; 75/228

[56] References Cited

U.S. PATENT DOCUMENTS

| | | | |
|---|---|---|---|
| 4,764,212 | 8/1988 | Okumura et al. | 75/228 |
| 5,610,366 | 3/1997 | Fleurial et al. | 136/202 |

FOREIGN PATENT DOCUMENTS

5-335628  2/1993  Japan .

*Primary Examiner*—Teresa J. Walberg
*Assistant Examiner*—Jeffrey Pwu
*Attorney, Agent, or Firm*—Ostrolenk, Faber, Gerb & Soffen, LLP

[57] ABSTRACT

Thermo-electric material has a composition containing at least one first element selected from the group consisting of Bi and Sb and at least one second element selected from the group consisting of Te and Se, and the crystal grains of the thermo-electric material have a mean crystal grain diameter equal to or less than 50 microns and a mean aspect ratio between 1 and 3 so as to achieve a large figure of merit equal to or greater than $3.4 \times 10^{-3}$ /°K.

10 Claims, 6 Drawing Sheets

Fig. 10 though the resistivity is decreased, the figure of merit is not improved.

THERMO-ELECTRIC MATERIAL HAVING MEAN CRYSTAL GRAIN DIAMETER NOR GREATER THAN 50 MICRONS AND MEAN ASPECT RATIO BETWEEN 1 AND 3 FOR LARGE FIGURE OF MERIT AND THERMO-ELECTRIC ELEMENT USING THE SAME

FIELD OF THE INVENTION

This invention relates to thermo-electric material and a thermo-electric element formed thereof and, more particularly, to a thermo-electric converting material having a large figure of merit and a thermo-electric element available for a high-efficiency thermo-electric generation and a high-efficiency thermo-electric refrigeration.

DESCRIPTION OF THE RELATED ART

Conventionally, a thermo-electric element is produced as follows. Molten thermo-electric material is cooled down by using a rapid liquid-phase quenching technique, and laminae are formed from the molten thermo-electric material. The laminae are pulverized into powder, and the powder is solidified through a hot pressing. In the following description, term "aspect ratio" means a quotient obtained by dividing the maximum diameter of a crystal grain by the minimum diameter of the crystal grain.

Figure 1:
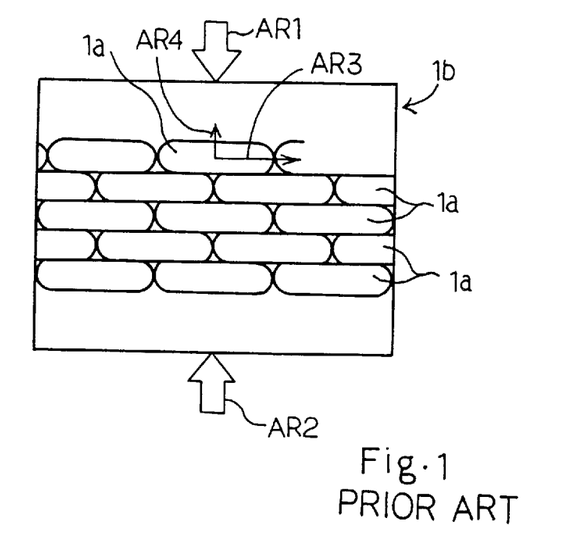
FIG. 1 is a schematic view showing the anisotropic grains of the prior art thermo-electric element.

FIG. 1 schematically illustrates the crystal grains 1a of the prior art thermo-electric element 1b solidified through the hot pressing. The powder of thermo-electric material is hot pressed in the direction indicated by arrows AR1/AR2. The crystal grains 2 are grown during the hot pressing in such a manner as to have a-axis in a direction AR3 perpendicular to the directions AR1/AR2 and c-axis in a direction AR4 parallel to the directions AR1/AR2. The thermo-electric material usually has a crystal anisotropy, and the crystal grains 1a are elongated along a-axis. The crystal grain is grown to several millimeters long, and the aspect ratio is equal to or greater than 5.

The prior art thermo-electric element is produced through another process as follows. Firstly, molten thermo-electric material is rapidly cooled down so as to produce the laminae as similar to the prior art process. The laminae are bundled, and the bundle of the laminae is sintered so as to be solidified into the prior art thermoelectric element. The sintered thermo-electric element has crystal grains grown in the direction of the thickness.

Even though the prior art thermo-electric element is produced through either prior art process, the figure of merit Z represents the thermo-electric characteristics of the thermoelectric element. The figure of merit Z is calculated by the following equation.

$$Z = \text{alpha}^2 / (\text{rho} \times \text{kappa}) \qquad 1$$

where alpha is Seebeck coefficient (micro-V/K), rho is resistivity (ohm m) and kappa is heat conductivity (W/m °K).

The heat conductivity is increased together with the crystal grains. On the other hand, when the crystal grains become smaller, the heat conductivity is decreased, and the resistivity is increased. Japanese Patent Publication of Unexamined Application (JPA) No. 5-335628 teaches that the figure of merit of the thermo-electric element 1b consisting of the anisotropic crystal grains 1a is variable depending upon the direction of electric current and heat.

In detail, when heat and electric current flow through the crystal grains 1a in the direction AR3 parallel to a-axis, the heat conductivity is increased and the resistivity is decreased as if the crystal grains are enlarged. On the other hand, when heat and electric current flow through the crystal grains 1a in the direction AR4 parallel to c-axis, the heat conductivity is decreased and the resistivity is increased as if the crystal grains 1a are shrunk. Thus, when the electric current and the heat are oriented in the direction parallel to the longitudinal direction of the anisotropic crystal grains 1a, although the heat conductivity is increased, the resistivity is decreased, and the figure of merit is improved. The thermo-electric power does not have a directional dependency.

However, a problem is encountered in the prior art anisotropic thermo-electric element in that the figure of merit is not so large as expected. This is because of the fact that the anisotropic crystal grains 1a increase the heat conductivity. In fact, a prior art anisotropic thermo-electric element has a small figure of merit less than $3.0 \times 10^{-3}$ (1/° K).

SUMMARY OF THE INVENTION

It is therefore an important object of the present invention to provide a thermo-electric material which achieves a large figure of merit equal to or greater than $3.4 \times 10^{-3}$ (1/°K).

It is also an important object of the present invention to provide a thermo-electric element which achieves an improved converting efficiency.

The present inventors produced various samples different in the aspect ratio and the mean crystal grain diameter, and found that appropriately regulated aspect ratio and the mean crystal grain diameter affected the figure of merit.

To accomplish the object, the present invention proposes to cause a mean crystal grain diameter and a mean aspect ratio to be equal to or less than 50 microns and range between 1 and 3.

In accordance with one aspect of the present invention, there is provided a thermo-electric material having a composition containing at least one first element selected from the group consisting of Bi and Sb and at least one second element selected from the group consisting of Te and Se, and produced from crystal grains having a mean crystal grain diameter equal to or less than 50 microns and a mean aspect ratio ranging from 1 to 3.

In accordance with another aspect of the present invention, there is provided a thermo-electric element formed of a thermo-electric material having a composition containing at least one first element selected from the group consisting of Bi and Sb and at least one second element selected from the group consisting of Te and Se, and produced from crystal grains having a mean crystal grain diameter equal to or less than 50 microns and a mean aspect ratio ranging from 1 to 3.

BRIEF DESCRIPTION OF THE DRAWINGS

The features and advantages of the thermo-electric material and the thermo-electric element according to the present invention will be more clearly understood from the following description taken in conjunction with the accompanying drawings in which.

DESCRIPTION OF THE PREFERRED EMBODIMENT

Influence Factors

The present inventors evaluated samples of a thermoelectric element. The present inventors considered what factors affected the figure of merit of the samples, and determined an optimum range for each of the influence factors.

The present inventors produced samples of a thermo-electric element through as follows. The stating material was $Bi_{0.5}Sb_{1.5}Te_3$ and Te, and Te was mixed with $Bi_{0.5}Sb_{1.5}Te_3$ at 1 percent by weight. The mixture was melted, and, thereafter, was rapidly cooled down so as to obtain laminae. The laminae was pulverized into powder, and the powder was hot pressed. The samples had the aspect ratio of 2.3. However, the mean crystal grain diameters ranged from 10 microns through 200 microns. In the following description, term "direction of hot-pressing" means the direction of force applied to the powder during the hot-pressing.

Figure 2:
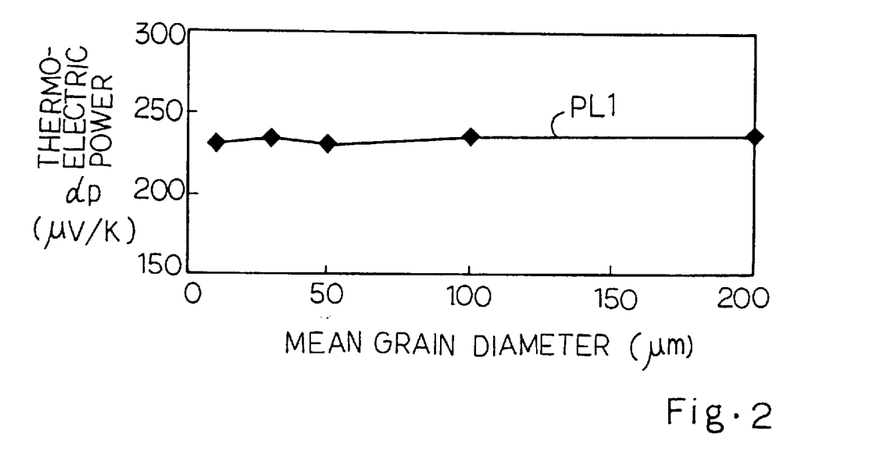
FIG. 2 is a graph showing thermo-electric power in terms of the mean crystal grain diameter of samples of a thermo-electric element.

The present inventors firstly measured the thermo-electric power alpha-p of the samples in the direction of hot pressing, and the thermo-electric power alpha-p was plotted in terms of the mean crystal grain diameter as shown in FIG. 2. As will be understood from plots PL1, the mean crystal grain diameter had no influence on the thermo-electric power.

Figure 3A:
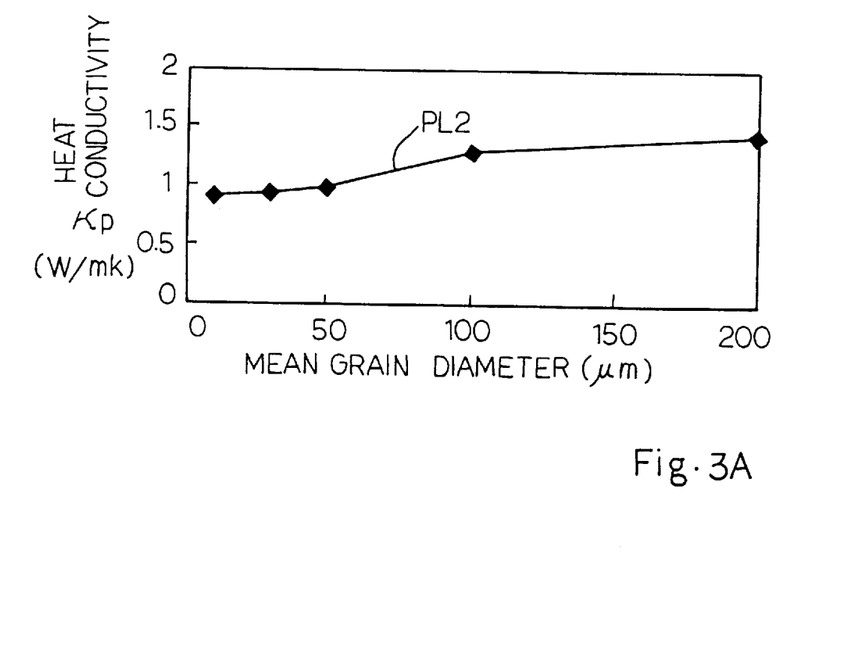
FIGS. 3A to 3C are graphs showing heat conductivity in terms of the means crystal grain diameter of the samples.
Figure 3B:
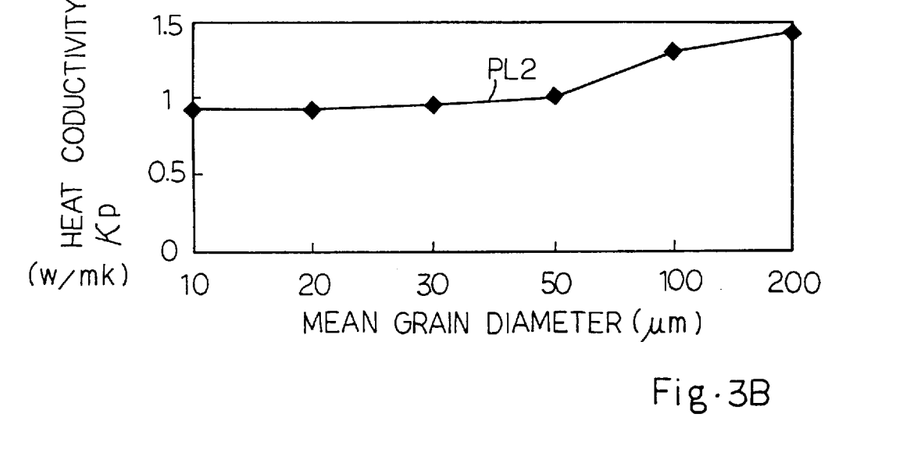
Figure 3C:
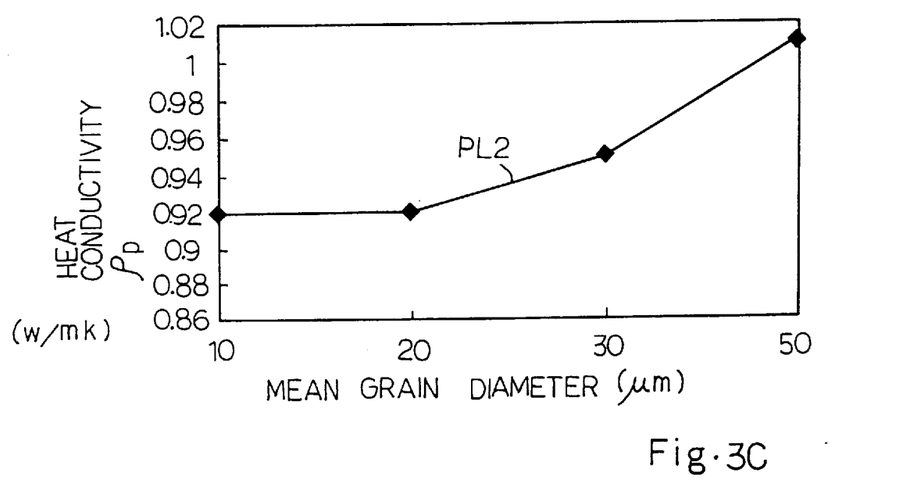
Figure 4:
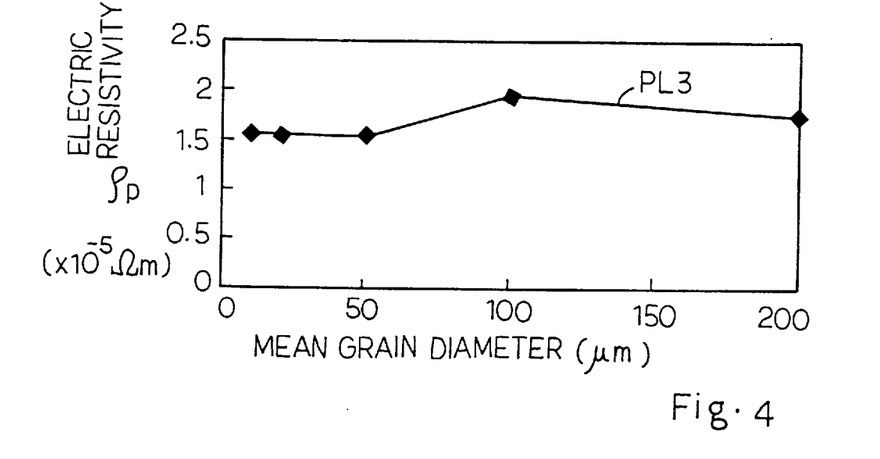
FIG. 4 is a graph showing electric resistivity in terms of the means crystal grain diameter of the samples.

Subsequently, the present inventors measured the heat conductivity kappa-p and the electric resistivity rho-p of the samples in the direction of hot pressing, and the heat conductivity and the electric resistivity were plotted in FIGS. 3 and 4, respectively.

Plots PL2 indicated that the mean crystal grain diameter had an influence on the heat conductivity kappa-p. The heat conductivity kappa-p was increased together with the mean crystal grain diameter, and the increment was increased around 50 microns.

Plots PL3 also indicated that the electric resistivity rho-p was affected by the mean crystal grain diameter. The electric resistivity rho-p was substantially constant below 50 microns. However, when the mean crystal grain diameter exceeded 50 microns, the electric resistivity rho-p was increased together with the mean crystal grain diameter.

Figure 5:
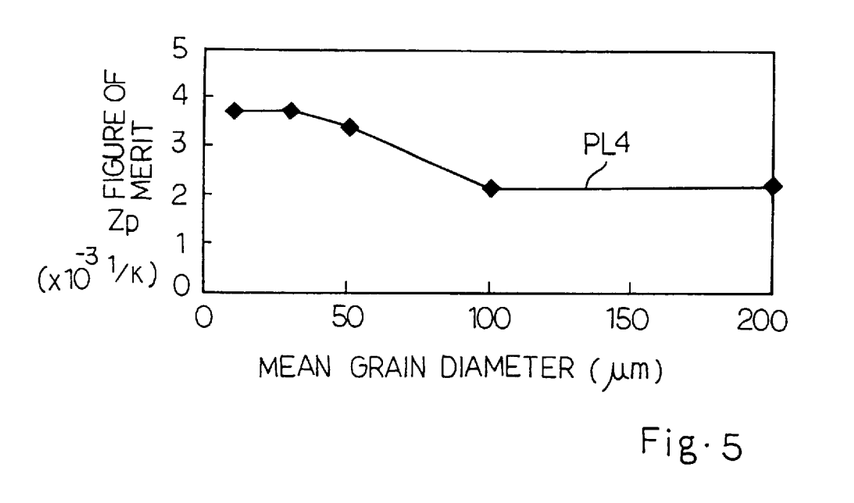
FIG. 5 is a graph showing the figure of merit in terms of the mean crystal grain diameter of the samples.

The present inventors calculated the figure of merit Zp in the direction of hot pressing on the basis of the thermo-electric power alpha-p, the heat conductivity kappa-p and the electric resistivity rho-p, and the figure of merit Zp was plotted in terms of the mean crystal grain diameter as shown in FIG. 5. As described hereinbefore, the thermo-electric power alpha-p was substantially constant. Therefore, the figure of merit Zp was inversely proportional to the electric resistivity rho-p and the heat conductivity kappa-p. Plots PL4 indicated that the figure of merit Zp was decreased in inversely proportional to the mean crystal grain diameter. When the mean crystal grain diameter exceeded 50 microns, the decrement became large. For this reason, the present inventors concluded that a target figure of merit equal to or greater than $3.4 \times 10^{-3} (1/°K)$ required the thermo-electric material to have the mean crystal grain diameter not greater than 50 microns. If the mean crystal grain diameter was equal to or less than 20 microns, the figure of merit was further improved.

Subsequently, the present inventors evaluated the aspect ratio of crystal grains of thermo-electric material. The present inventors mixed Te with $Bi_{0.4}Sb_{1.6}Te_3$ at 2 percent by weight, and the mixture was melted. The molten material was rapidly cooled down so as to obtain laminae, and the laminae were pulverized into powder. The powder was hot pressed, and the samples were completed. The present inventors measured the mean crystal grain diameters and the aspect ratio of crystal grains, i.e., the ratio between the maximum diameter dv and the minimum diameter dp. The mean crystal grain diameter was of the order of 35 microns, and the aspect ratio ranged from 1 to 6.

Figure 6:
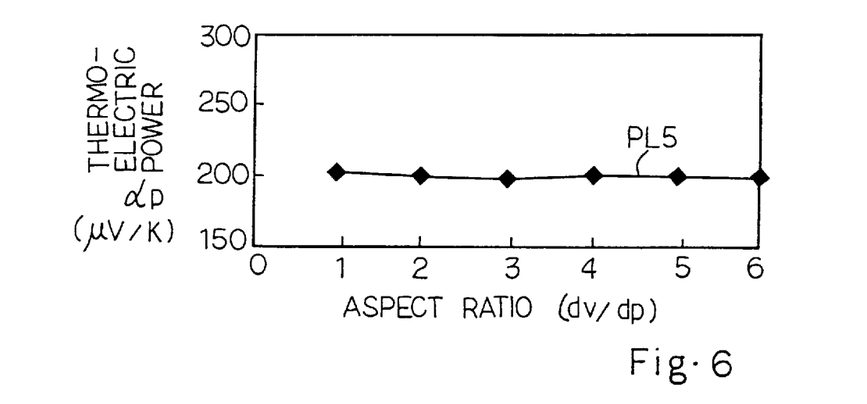
FIG. 6 is a graph showing thermo-electric power in terms of the aspect ratio of samples of a thermo-electric element.

The present inventors firstly measured the thermoelectric power alpha-p of the samples in the direction of hot pressing, and plotted the thermo-electric power in terms of the aspect ratio dv/dp as indicated by plots PL5 in FIG. 6. The thermo-electric power alpha-p was less affected by the aspect ratio dv/dp.

Figure 7:
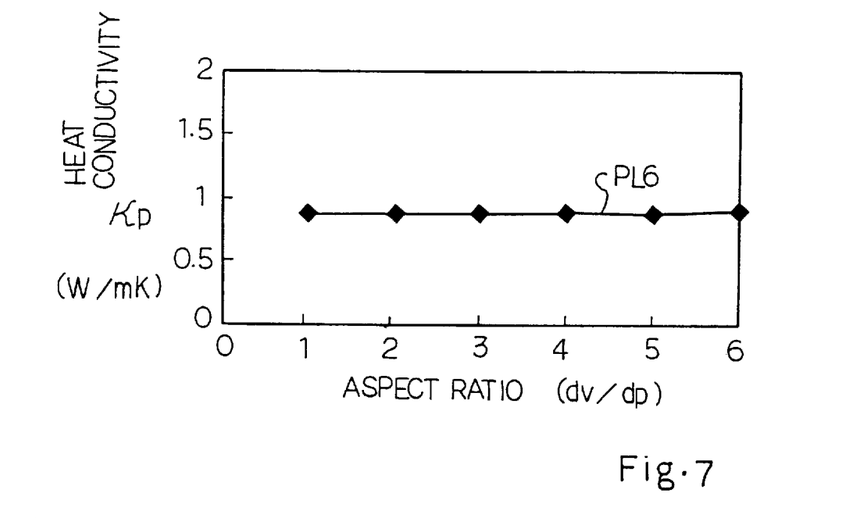
FIG. 7 is a graph showing heat conductivity in terms of the aspect ratio of the samples.

Subsequently, the present inventors measured the heat conductivity kappa-p of the samples in the direction of hot pressing, and plotted the heat conductivity kappa-p in terms of the aspect ratio dv/dp as indicated by plots PL6 in FIG. 7. The heat conductivity kappa-p was also less affected by the aspect ratio dv/dp.

Figure 8:
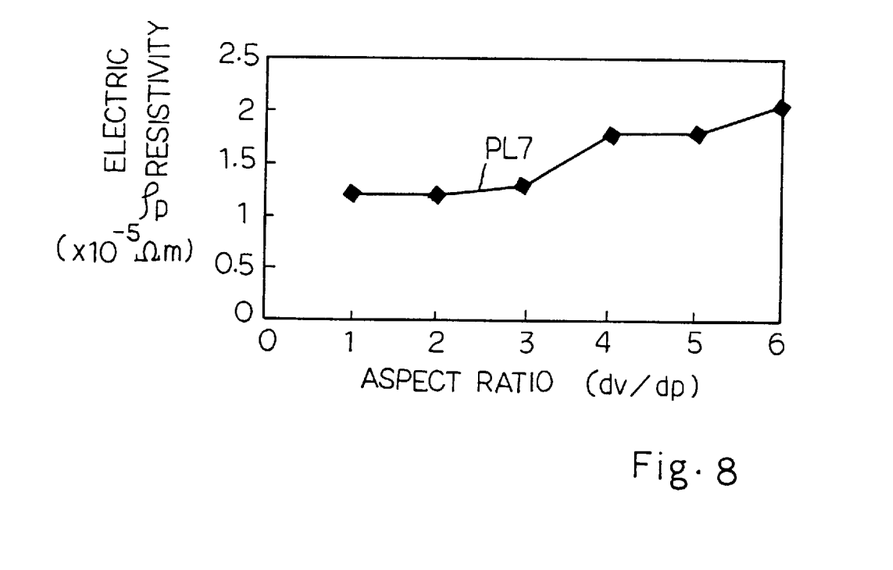
FIG. 8 is a graph showing electric resistivity in terms of the aspect ratio of the samples.

Finally, the present inventors measured the electric resistivity rho-p of the samples in the direction of hot pressing, and plotted the electric resistivity rho-p in terms of the aspect ration dv/dp as indicated by plots PL7 in FIG. 8. The electric resistivity rho-p was substantially constant until the aspect ratio dv/dp of 3. However, when the aspect ration dv/dp exceeded 3, the electric resistivity rho-p was increased.

Figure 9:
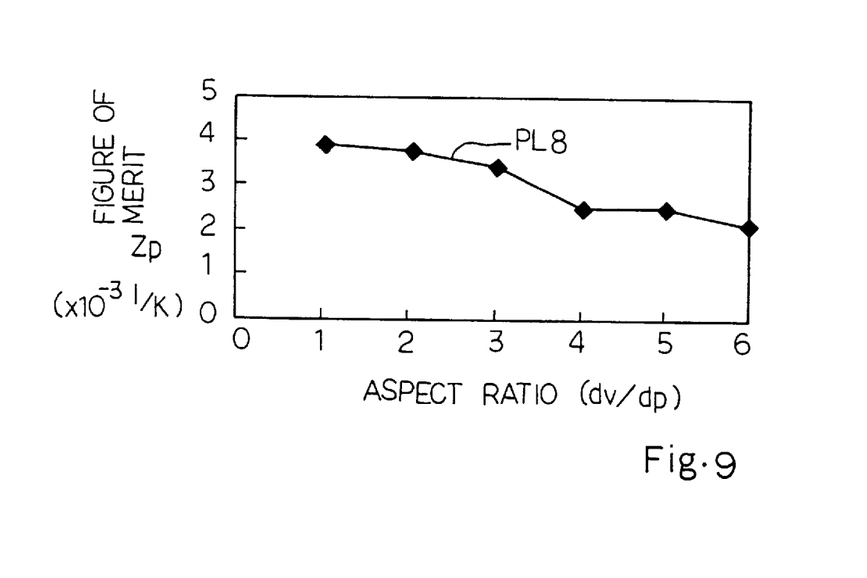
FIG. 9 is a graph showing the figure of merit in terms of the aspect ratio of the samples.

The present inventors calculated the figure of merit Zp on the basis of the thermo-electric power alpha-p, the heat conductivity kappa-p and the electric resistivity rho-p, and plotted the figure of merit Zp as indicated by plots PL8 in FIG. 9. As described hereinbefore, the thermo-electric power alpha-p and the heat conductivity kappa-p were substantially constant with respect to the aspect ratio dv/dp, and the electric resistivity rho-p was increased from the aspect ratio dv/dp of 3. Accordingly, when the aspect ratio dv/dp exceeded "3", the figure of merit Zp was decreased below $3.4 \times 10^{-3}$ $(1/°K)$, and the present inventors concluded that the target figure of merit required the crystal grains of the thermo-electric material to have the aspect ratio dv/dp ranging from 1 to 3. The aspect ration dv/dp between 1 and 2 was more preferable.

Process Conditions for Micro Crystal Grain

The target small mean crystal grain diameter and the target small aspect ratio were achieved by using a hot pressing on powder pulverized from laminae obtained by a liquid-phase rapid quenching technique. A single rolling technique was used as the liquid-phase rapid quenching technique. The single rolling technique quenched the molten thermo-electric material at $10^3$ °K to $10^6$ °K, and formed the laminae from the molten thermo-electric material. The laminae was pulverized into the powder equal in mean particle diameter to or less than 50 microns. The fine powder was hot pressed in vacuum or argon ambience at 300° C. to 500° C. for 30 minutes to 180 minutes under the pressure of 400 kgf/cm$^2$, by way of example. A thermo-electric element thus treated had micro-crystal grains equal in mean crystal grain diameter to or less than 50 microns, and the mean aspect ratio of the micro-crystal grains ranged from 1 to 3.

Direction of Current and Heat

Using samples of the thermo-electric element with the micro-crystal grains, the present inventors investigated the influence of the direction of electric current and heat on the heat conductivity and the electric resistivity. The present inventors found the following phenomena. When the aspect ratio of the micro-crystal grains was small, the samples had a large heat conductivity kappa-v and a small electric resistivity rho-v in the direction perpendicular to the direction of hot pressing, i.e., in the direction of a-axis, but both of the heat conductivity kappa-p and the electric resistivity rho-p were small in the direction of hot pressing, i.e., in the direction of c-axis.

In the samples with small aspect ratio and the samples with large aspect ratio, the heat conductivity kappa-v along a-axis, the heat conductivity kappa-p along c-axis, the electric resistivity rho-v along a-axis and the electric resistivity rho-p -p along c-axis satisfied the following relations.

kappa-p2<kappa-p1<kappa-v2<kappa-v1  2 rho-v1≈rho-p2≈rho-v2≈rho-p1  3 where kappa-p1 was the heat conductivity of the sample with large aspect ration in the direction of c-axis, kappa-p2 was the heat conductivity of the sample with small aspect ration in the direction of c-axis, kappa-v1 was the heat conductivity of the sample with large aspect ration in the direction of a-axis, kappa-v2 was the heat conductivity of the sample with small aspect ration in the direction of a-axis, rho-p1 was the electric resistivity of the sample with large aspect ration in the direction of c-axis, rho-p2 was the electric resistivity of the sample with small aspect ration in the direction of c-axis, rho-v1 was the electric resistivity of the sample with large aspect ration in the direction of a-axis, and rho-v2 was the electric resistivity of the sample with small aspect ratio in the direction of a-axis.

From the relations 2 and 3, we obtained the following inequalities.

kappa-v1×rho-v1>kappa-v2×rho-v2  4 kappa-v1×rho-v1>kappa-p2×rho-p2  5

The smaller the product (kappa×rho) was, the larger the figure of merit was. The present inventors concluded that the sample with small aspect ratio improved the figure of merit rather than the sample with large aspect ratio in so far as the direction was identical such as a-axis. The present inventors further concluded that the sample with small aspect ratio improved the figure of merit regardless of the direction of heat rather than the sample with large aspect ratio where the heat flows along a-axis.

From relations 2 and 3, kappa-p2 was less than kappa-v2, and rho-p2 was nearly equal to rho-v2. Then, we obtained the following inequality.

kappa-p2×rho-p2<kappa-v2×rho-v2  6

The inequality 6 taught us that, when comparing the samples with small aspect ratio with one another, the figure or merit was increased by causing the heat to flow along c-axis of a small heat conductivity, i.e., in the direction in parallel to the direction of hot pressing.

EXAMPLES

The present inventors produced samples from thermo-electric materials different in composition from one another, and measured the mean crystal grain diameter and the mean aspect ratio. Subsequently, the present inventors measured the Seebeck coefficient alpha, the heat conductivity kappa and the electric resistivity rho, and calculated the figure of merit.

Figure 10:
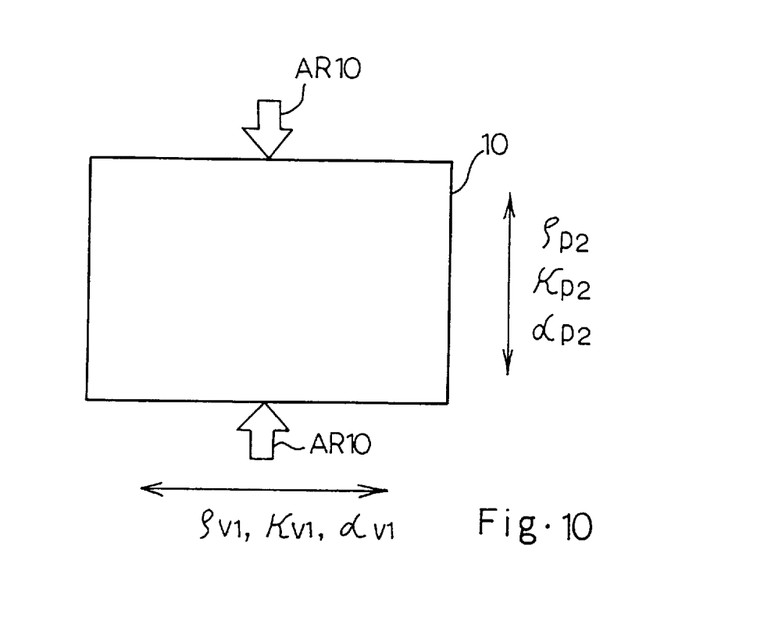
FIG. 10 is a schematic view showing a measurement of Seebeck coefficient, heat conductivity and electric resistivity for a sample.

FIG. 10 illustrated the measurement of the Seebeck coefficient alpha, the heat conductivity kappa and the electric resistivity rho. The samples 10 was hot pressed with force indicated by arrows AR10. The Seebeck coefficient, the heat conductivity and the electric resistivity measured in the direction of hot pressing were suffixed with "p2". On the other hand, when the Seebeck coefficient, the heat conductivity and the electric resistivity were measured in the direction perpendicular to the direction of hot pressing, the Seebeck coefficient, the heat conductivity and the electric resistivity were suffixed with "v1".

Samples 1 to 6 and 13 to 15 fell within the scope of the present invention, and samples 7 to 12 and 16 to 18 were out of the scope of the present invention. The mean crystal grain diameter and the mean aspect ratio were shown in Table 1, and the electric resistivity, the heat conductivity, the Seebeck coefficient and the figure of merit Z were summarized in Tables 2, 3 and 4.

TABLE 1

| Sample No. | Composition | Mean grain diameter | Mean aspect ratio |
|---|---|---|---|
| 1 | $Bi_{0.5}Sb_{1.5}Te_3$ + Te 2% by wt. | 8 microns | 1.5 |
| 2 | $Bi_{0.4}Sb_{1.6}Te_3$ + Te 4% by wt. | 11 microns | 1.8 |
| 3 | $Bi_{0.3}Sb_{1.7}Te_3$ + Te 4% by wt. | 32 microns | 2.1 |
| 4 | $Bi_{1.9}Sb_{0.1}Te_{2.65}Se_{0.35}$ + $SbI_3$ 0.2% by wt. | 10 microns | 2.0 |
| 5 | $Bi_{1.9}Sb_{0.1}Te_{2.85}Se_{0.15}$ + $SbI_3$ 0.1% by wt. | 32 microns | 1.2 |
| 6 | $Bi_2Te_{2.75}Se_{0.25}$ + $HgBr_2$ 0.1% by wt. | 15 microns | 1.6 |
| 7 | $Bi_{0.5}Sb_{1.5}Te_{2.91}Se_{0.09}$ | 0.7 mm | 8.1 |
| 8 | $Bi_{0.5}Sb_{1.5}Te_{2.85}Se_{0.15}$ | 0.8 mm | 7.3 |
| 9 | $Bi_{0.5}Sb_{1.5}Te_3$ | 1.3 mm | 8.9 |
| 10 | $Bi_2Te_{2.7}Se_{0.3}$ + $HgBr_2$ 0.09% by wt. | 0.9 mm | 6.9 |
| 11 | $Bi_{1.9}Sb_{0.1}Te_{2.85}Se_{0.15}$ + $SbI_3$ 0.07% by wt. | 1.2 mm | 8.0 |
| 12 | $Bi_{1.7}Sb_{0.3}Te_{2.85}Se_{0.15}$ + $SbI_3$ 0.1% by wt. | 1.1 mm | 10.2 |
| 13 | $Bi_{1.9}Sb_{0.1}Te_{2.85}Se_{0.15}$ + AgI 0.1% by wt. | 8 microns | 1.9 |
| 14 | $Bi_{1.9}Sb_{0.1}Te_{2.85}Se_{0.15}$ + CuI 0.12% by wt. | 11 microns | 2 |
| 15 | $Bi_2Te_{2.85}Se_{0.15}$ + $HgCl_2$ 0.1% by wt. | 9 microns | 1.8 |
| 16 | $Bi_{1.9}Sb_{0.1}Te_{2.85}Se_{0.15}$ + AgI 0.09% by wt. | 0.7 mm | 5 |
| 17 | $Bi_{1.9}Sb_{0.1}Te_{2.85}Se_{0.15}$ + CuI 0.1% by wt. | 1.1 mm | 6.1 |
| 18 | $Bi_2Te_{2.85}Se_{0.15}$ + $HgCl_2$ 0.08% by wt. | 0.9 mm | 4.3 |

TABLE 2

| Sample No. | rho-p2 $10^{-5}$ ohm-m | kappa-p2 w/m° K. | alpha-p2 micro-V/°K. | Zp2 $10^{-3}$/°K. |
|---|---|---|---|---|
| 1 | 1.80 | 0.90 | 235 | 3.41 |
| 2 | 1.09 | 1.10 | 205 | 3.51 |
| 3 | 0.69 | 1.31 | 180 | 3.58 |
| 4 | 1.23 | 0.91 | −195 | 3.40 |
| 5 | 1.15 | 0.90 | −192 | 3.60 |
| 6 | 1.26 | 0.95 | −202 | 3.41 |

TABLE 3

| Sample No. | rho-p2 $10^{-5}$ ohm-m | kappa-p2 w/m°K. | alpha-p2 micro-V/°K. | Zp2 $10^{-3}$/°K. |
|---|---|---|---|---|
| 7 | 1.09 | 1.32 | 194 | 2.62 |
| 8 | 1.58 | 1.23 | 213 | 2.33 |
| 9 | 1.06 | 1.35 | 192 | 2.58 |
| 10 | 1.11 | 1.35 | −198 | 2.62 |
| 11 | 1.21 | 1.28 | −2.8 | 2.79 |
| 12 | 2.21 | 1.21 | −199 | 1.48 |

TABLE 4

| Sample No. | rho-p2 $10^{-5}$ ohm-m | kappa-p2 w/m°K. | alpha-p2 micro-V/°K. | Zp2 $10^{-3}$/°K. |
|---|---|---|---|---|
| 13 | 1.31 | 0.91 | −202 | 3.42 |
| 14 | 1.18 | 0.94 | −195 | 3.42 |
| 15 | 1.25 | 0.95 | −205 | 3.53 |
| 16 | 1.1 | 1.38 | −200 | 2.64 |
| 17 | 1.06 | 1.3 | −198 | 2.84 |
| 18 | 1.05 | 1.28 | −195 | 2.83 |

The sample Nos. 1 to 6 and 13 to 15 had the mean crystal grain diameters not greater than 50 microns and the mean aspect ratio between 1 to 3, and achieved the figure of merit equal to or greater than 3.40. On the other hand, the sample Nos. 7–12 and 16–18 were larger in both of the mean crystal grain diameter and the mean aspect ratio than samples 1 to 6 and 13 to 15, and were out of the scope of the present invention. The samples 7 to 12 and 16 to 18 merely achieved small figure of merit less than 3.00.

Thermo-Electric Element

The present inventors fabricated a Peltier module of thermo-electric material with the figure of merit of $3.4 \times 10^{-3}$/°K, and evaluated the Peltier module in view of maximum temperature difference delta-Tmax and the maximum endoergic quantity. The Peltier module achieved the maximum temperature difference equal to or greater than 70° K and the maximum endoergic quantity equal to or grater than 8 watt/cm². Using the Peltier module, the present inventors created a temperature difference of 10° K from room temperature, and the electric power consumption was reduced at 30 percent with respect to the prior art Peltier module.

The Peltier module according to the present invention is available for refrigeration of a charge-coupled device, a semiconductor laser emitting device and a high-integration CPU board.

As will be appreciated from the foregoing description, the thermo-electric material according to the present invention has the crystal grains having the mean crystal grain diameter not greater than 50 microns and the mean aspect ratio between 1 and 3, and achieves a larger figure of merit equal to or greater than $3.4 \times 10^{-3}$/°K.

Although particular embodiments of the present invention have been shown and described, it will be obvious to those skilled in the art that various changes and modifications may be made without departing from the spirit and scope of the present invention.

What is claimed is:

1. A thermo-electric material having a composition consisting essentially of at least one first element selected from the group consisting of Bi and Sb and at least one second element selected from the group consisting of Te and Se, and produced from crystal grains having a mean crystal grain diameter equal to or less than 50 microns and a mean aspect ratio ranging from 1 to 3.

2. The thermo-electric material as set forth in claim 1, in which said composition further contains at least one third element selected from the group consisting of I, Cl, Br, Hg, Ag and Cu.

3. The thermo-electric material as set forth in claim 1, in which said means crystal grain diameter is equal to or less than 20 microns, and said mean aspect ratio ranges from 1 to 2.

4. A thermo-electric element formed of a thermo-electric material having a composition consisting essentially of at least one first element selected from the group consisting of Bi and Sb and at least one second element selected from the group consisting of Te and Se, and produced from crystal grains having a mean crystal grain diameter equal to or less than 50 microns and a mean aspect ratio ranging from 1 to 3.

5. The thermo-electric element as set forth in claim 4, in which said composition further contains at least one third element selected from the group consisting of I, Cl, Br and Hg.

6. The thermo-electric element as set forth in claim 4, in which said means crystal grain diameter is equal to or less than 20 microns, and said mean aspect ratio ranges from 1 to 2.

7. The thermo-electric element as set forth in claim 4, in which said crystal grains have a-axis perpendicular to a direction of force exerted on said thermo-electric material during a hot-pressing and c-axis in parallel to said direction of force.

8. The thermoelectric element as set forth in claim 7, in which electric current and heat flow in a direction parallel to said c-axis.

9. The thermo-electric material as set forth in claim 2, in which said means crystal grain diameter is equal to or less than 20 microns, and said mean aspect ratio ranges from 1 to 2.

10. The thermo-electric element as set forth in claim 5, in which said means crystal grain diameter is equal to or less than 20 microns, and said mean aspect ratio ranges from 1 to 2.

* * * * *